(12) United States Patent
Benaissa et al.

(10) Patent No.: US 8,232,158 B2
(45) Date of Patent: Jul. 31, 2012

(54) COMPENSATED ISOLATED P-WELL DENMOS DEVICES

(75) Inventors: Kamel Benaissa, Dallas, TX (US); Greg C. Baldwin, Plano, TX (US); Vineet Mishra, Bangalore (IN); Ananth Kamath, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 201 days.

(21) Appl. No.: 12/824,944

(22) Filed: Jun. 28, 2010

(65) Prior Publication Data

US 2011/0156144 A1    Jun. 30, 2011

Related U.S. Application Data

(60) Provisional application No. 61/220,725, filed on Jun. 26, 2009.

(51) Int. Cl.
*H01L 21/8249*    (2006.01)

(52) U.S. Cl. ........ 438/218; 438/200; 438/208; 438/286; 257/338; 257/E21.067; 257/E21.632

(58) Field of Classification Search .................. 438/218, 438/200, 208, 286; 257/338, E21.067, E21.632
See application file for complete search history.

(56) References Cited

U.S. PATENT DOCUMENTS

| | | | |
|---|---|---|---|
| 2005/0253191 A1* | 11/2005 | Pendharkar et al. | 257/335 |
| 2006/0113592 A1* | 6/2006 | Pendharkar et al. | 257/335 |
| 2010/0117150 A1* | 5/2010 | Pendharkar et al. | 257/337 |
| 2010/0327335 A1* | 12/2010 | Benaissa et al. | 257/300 |
| 2011/0012196 A1* | 1/2011 | Williams et al. | 257/343 |

* cited by examiner

*Primary Examiner* — Jarrett Stark
*Assistant Examiner* — John M Parker
(74) *Attorney, Agent, or Firm* — Jacqueline J. Garner; Wade J. Brady, III; Frederick J. Telecky, Jr.

(57) ABSTRACT

An integrated circuit with a core PMOS transistor formed in a first n-well and an isolated DENMOS (iso-DENMOS) transistor formed in a second n-well where the depth and doping of the first and second n-wells are the same. A method of forming an integrated circuit with a core PMOS transistor formed in a first n-well and an iso-DENMOS transistor formed in a second n-well where the depth and doping of the first and second n-wells are the same.

9 Claims, 11 Drawing Sheets

COMPENSATED ISOLATED P-WELL DENMOS DEVICES

FIELD OF THE INVENTION

This invention relates to the field of integrated circuits. More particularly, this invention relates to a drain extended NMOS device in an isolated p-well.

BACKGROUND OF THE INVENTION

Integrated circuits often require high voltage transistors in addition to low voltage transistors. The addition of high voltage transistors may significantly increase manufacturing cost by adding a second thicker gate dielectric to support a higher voltage and by adding additional photoresist patterns and implants for high voltage wells and source and drain extensions.

One method to avoid some of the cost of adding high voltage transistors to a baseline CMOS process flow is to construct drain extended MOS transistors (DEMOS). DEMOS transistors eliminate the need add a second, thicker gate dielectric to support the high voltage by building a depleted drift region in series with the drain of a low voltage transistor gate so that sufficient voltage is dropped across the drift region to protect the low voltage gate dielectric. This enables a low voltage transistor gate to reliably switch high voltage without damage to the low voltage gate dielectric.

The conventional method for adding DENMOS transistors to a baseline CMOS process flow is to add a deep n-well pattern and deep n-well implant. A p-well is formed in the deep n-well. The DENMOS gate is formed over a p-well, n-well boundary and the drain contact is located in the n-well some distance from the gate. The n-well between the DENMOS gate and the drain contact forms the drift region of the DENMOS transistor.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit with a core PMOS transistor formed in a first n-well and an isolated drain extended NMOS (iso-DENMOS) transistor formed in a second n-well where the depth and doping of the first and second n-wells are the same. A method of forming an integrated circuit with a core PMOS transistor formed in a first n-well and an iso-DENMOS transistor formed in a second n-well where the depth and doping of the first and second n-wells are the same.

DETAILED DESCRIPTION

Figure 1A:
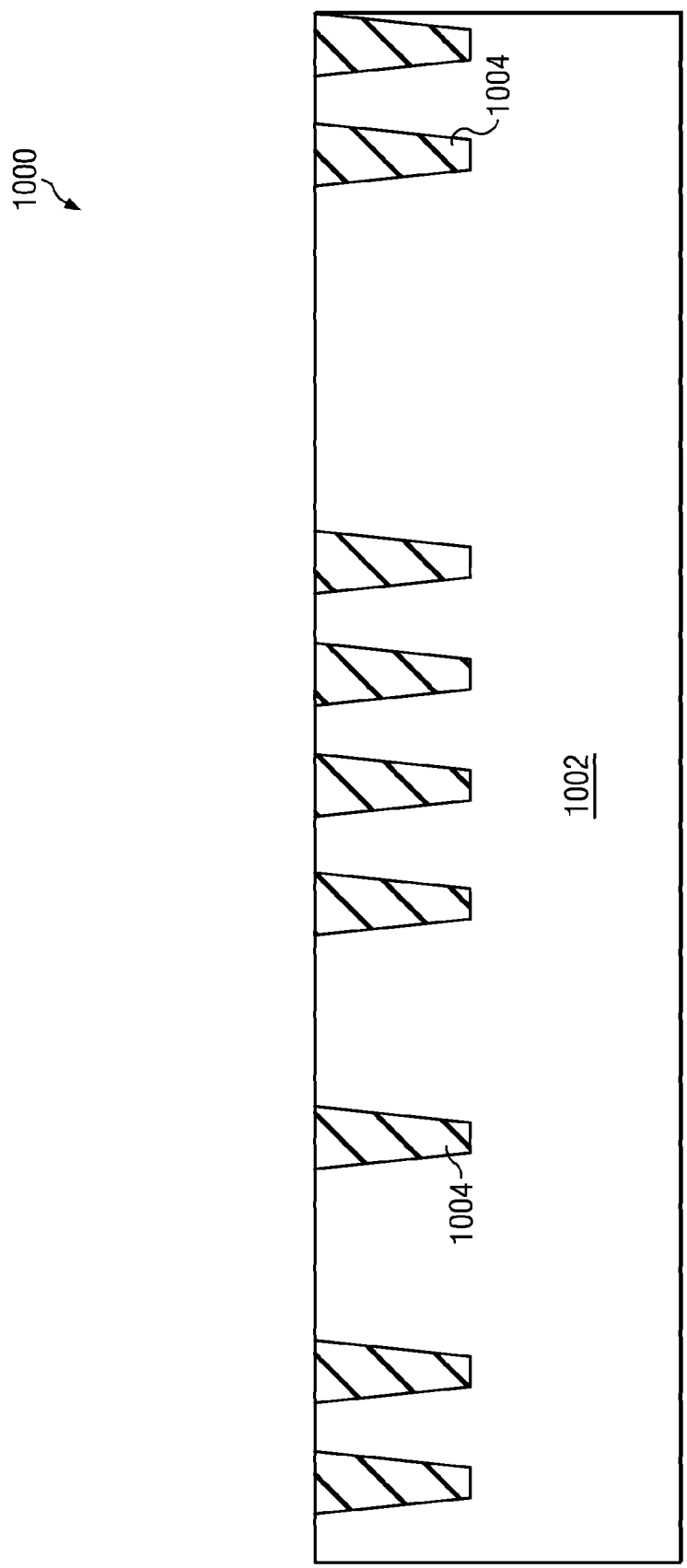
FIG. 1A through 1G are illustrations of steps in the fabrication of an isolated DENMOS incorporating this invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Drain extended MOS transistors (DEMOS) are desirable because they allow higher voltages to be switched on chip without the additional cost of adding an additional gate oxide thickness. High voltage switching on chip may disturb the logic in circuits that are in close proximity to the DEMOS transistors so it is desirable to construct isolated DEMOS transistors to prevent the high voltage switching from disturbing other circuits. The benefits and methods of forming DEMOS transistors are described in U.S. Pat. No. 6,548,874 which is incorporated herein by reference.

For DENMOS transistors, the commonly used method for adding DENMOS transistors to a baseline CMOS process flow is to add a deep n-well pattern and deep n-well implant. A p-well is formed in the deep n-well. The DENMOS gate is formed over a p-well, n-well boundary and the drain contact is located in the n-well some distance from the gate. The n-well between the DENMOS gate and the drain contact forms the drift region of the DENMOS transistor. Sensitive circuit transistors adjacent to the DENMOS transistor may be disturbed when the DENMOS transistor switches the high voltage.

Embodiments of the instant invention describe the formation of an iso-DENMOS transistor and an isolated p-well using a new baseline CMOS manufacturing flow such that the baseline CMOS manufacturing flow may be used with no additional processing steps. The p-well implants that form core p-wells for core NMOS transistors in a baseline CMOS process flow and the n-well implants that form the core n-wells for core PMOS transistors in a baseline CMOS process flow are carefully co-optimized so that they form a compensated, isolated p-well (ci-p-well) wholly contained within a core n-well when the core p-well implants are implanted into a portion of the core n-well. The core p-well dopant compensates the upper portion of the core n-well forming a ci-p-well within the core NMOS well. An iso-DENMOS transistor is formed using this ci-p-well as the iso-DENMOS transistor body. This provides additional high voltage switching capability to the integrated circuit without additional manufacturing cost and without additional cycle time. It also isolates integrated circuits and protects them from being disturbed by ground bounce when the iso-DENMOS transistor switches.

The iso-DENMOS structure according to an embodiment of the instant invention may be distinguished from a conventional DENMOS structure using a cross-sectional SEM or TEM. A conventional DENMOS transistor is formed using an isolated p-well contained within a separately formed deep n-well whereas the iso-DENMOS structure according to an embodiment of the instant invention is formed within a core n-well using the core p-well implants to compensate an upper portion of core n-well. In a conventional integrated circuit the DENMOS transistor is formed using an isolated p-well that is contained within a second, deeper n-well The term "baseline CMOS process flow" refers to a CMOS process flow that builds NMOS and PMOS transistors used to construct logic circuits and possibly SRAM memories which operate at the power supply voltage.

The terms "core n-well" and "core p-well" refer to the n-wells and p-wells which are formed using a baseline CMOS process flow.

The term "compensated, isolated p-well (ci-p-well)" refers to a p-well that is wholly contained within a core n-well and is electrically isolated from the p-type FIG. 1A through 1G briefly describes the major steps in a process flow that builds an iso-DENMOS transistor using ci-p-well for the body of the iso-DENMOS according to a first embodiment of the instant invention. The iso-DENMOS may be formed using a baseline CMOS process flow without additional masking and implantation steps thus saving significant manufacturing cost and cycle time.

Shown in FIG. 1A is an integrated circuit 1000 that has been processed through shallow trench isolation (STI). STI regions 1004 have been formed in a p-type substrate 1002 using well known methods.

Figure 1B:
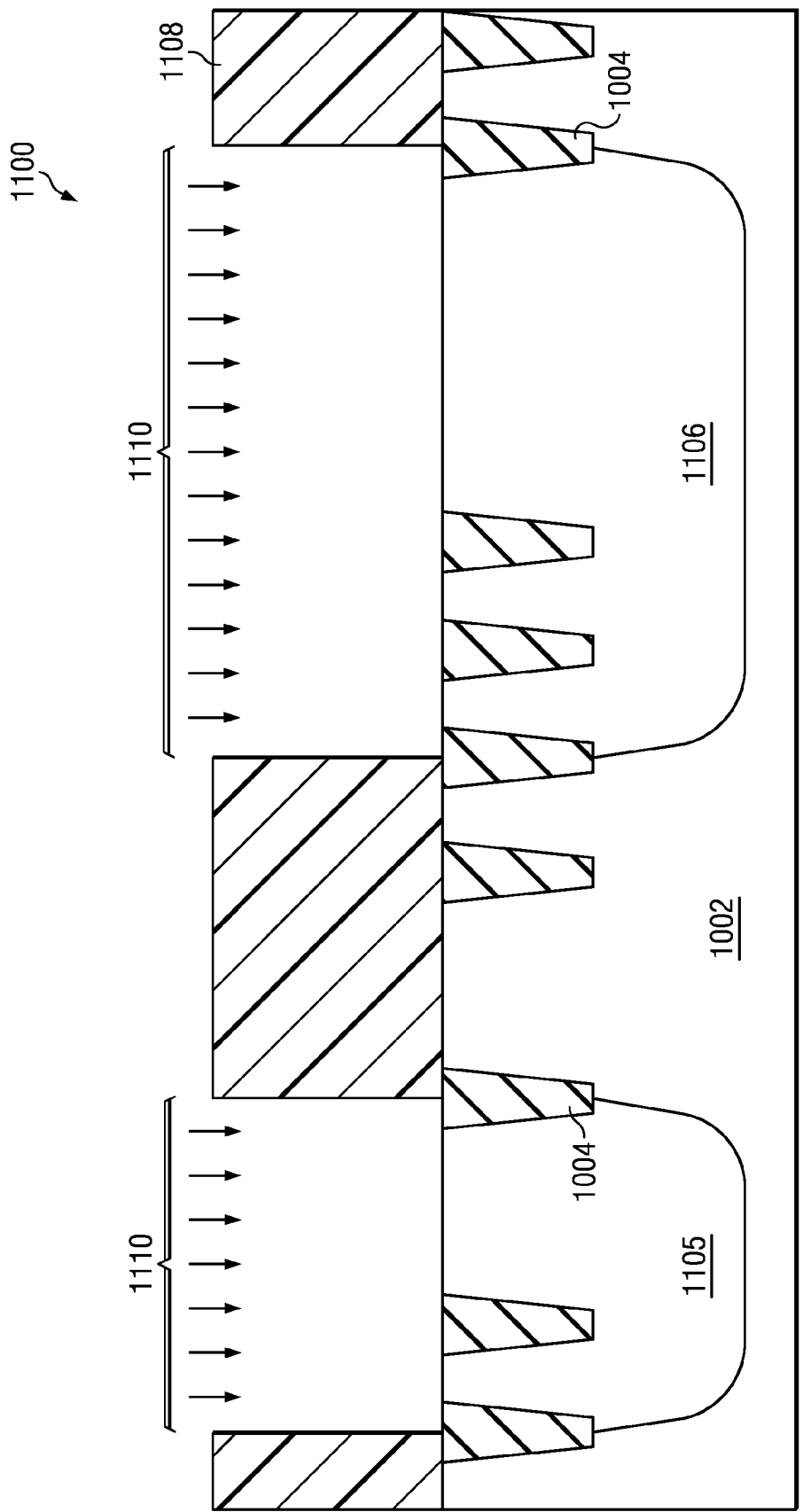

In FIG. 1B, an n-well photoresist pattern 1108 is formed over the integrated circuit 1000. The n-well dopant 1110, indicated by the arrows, is implanted to form an n-well 1105 in which core PMOS transistors may be formed and n-well 1106 in which an iso-DENMOS transistor may be formed. The n-well implant 1110 is typically a series of chained implants of phosphorus and possibly arsenic to counter dope the p-type substrate and form n-wells, 1105 and 1106. The series of chained implants typically are a low dose, low energy implant to set the turn on voltage (vt) of PMOS transistors, a slightly higher dose and energy punch through implant to increase the base doping of the parasitic npn bipolar transistor that forms under each PMOS transistor, an even higher dose and energy channel stop implant to raise the vt of the parasitic PMOS transistor formed under the STI region 1004, and a high dose, high energy implant to form a retrograde well profile with low resistance at the bottom of the n-wells 1105 and 1106. The dose and energy of these n-type implants along with the dose and energy of comparable p-type vt, punchthrough, channel stop, and p-well implants are co optimized according to this invention to form a ci-p-well structure when both the n-well and p-well series of implants are implanted into the same n-well, 1106 region.

Figure 1C:
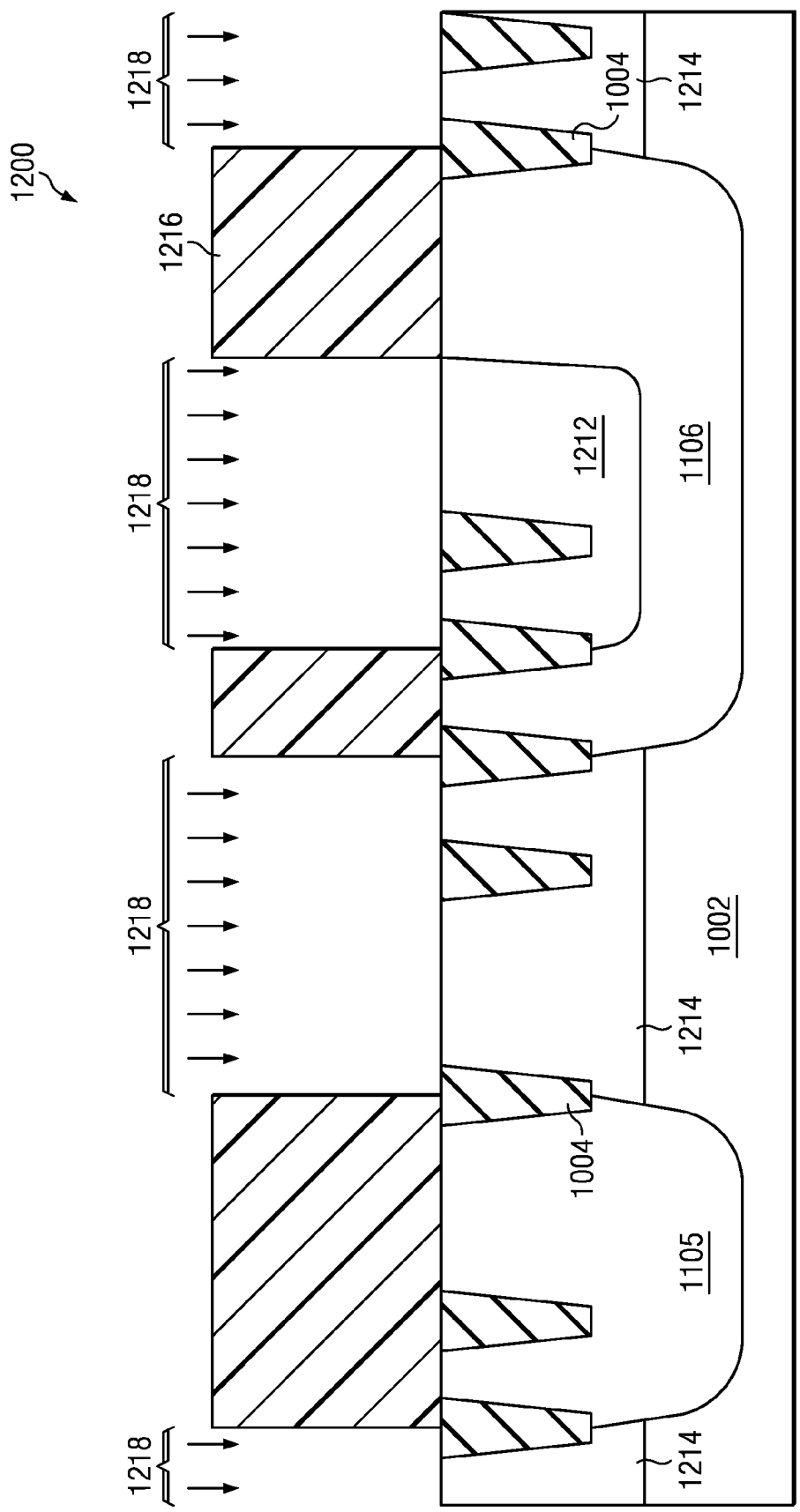

Referring now to FIG. 1C, the n-well pattern 1108 has been removed and a p-well photo resist pattern 1216 has been formed on the surface of the integrated circuit 1000 with openings over the areas outside the n-well regions, 1105 and 1106, where p-well regions are desired 1214 and also over a region within the n-well 1106 where an ci-p-well 1212 is formed. Along with the n-well implants, the p-well series of implants 1218 have been carefully co optimized so that in addition to the formation of p-well regions 1214 outside the n-well regions, 1105 and 1106, a region within n-well 1106 is counterdoped to form an electrically isolated ci-p-well, 1212. A core PMOS transistor is later constructed within n-well, 1105, and an iso-DENMOS transistor is later constructed in n-well 1106 with a ci-p-well 1212 body. After the wells have been implanted, the pattern is removed and the wells are annealed to activate the well dopants and to heal any implant damage that may have occurred.

Figure 1D:
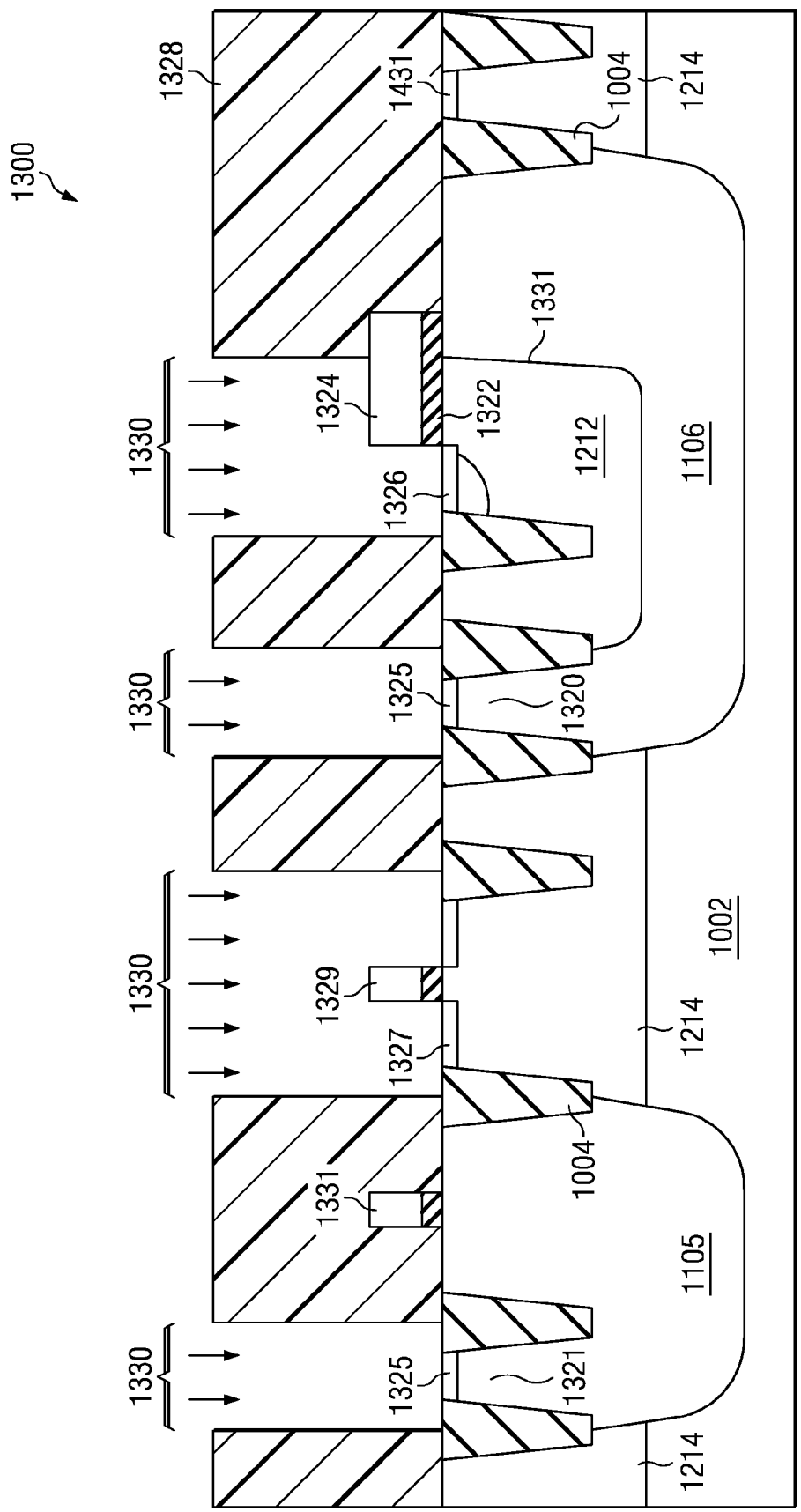

FIG. 1D shows the integrated circuit 1000 after it is processed through steps to form gate dielectric 1322 and a gate stack 1324 using well known processes. The gate dielectric 1322 and gate stack 1324 form the gate of the iso-DENMOS transistor and the gates of the core NMOS 1329 and core PMOS transistor 1331. The iso-DENMOS gate 1324 overlies the junction between the ci-p-well 1212 and the n-well 1106. The portion of the ci-p-well 1212 that the gate 1324 overlies forms the body of the iso-DENMOS transistor. The gate dielectric 1322 may be oxide, oxynitride, or a high dielectric constant (high-k) material. The gate stack 1324 may be doped or undoped polysilicon, or a conductive material such as a silicide or a metal. Other well known processing steps such as the formation of SiGe source and drains and the formation of offset spacers are commonly performed but are not shown so as not to obscure the instant invention. An extension photoresist pattern 1328 is formed on the surface of the integrated circuit 1000 with openings over the source side 1326 of the DENMOS transistor gate 1324 and over the n-well contact region 1320. The extension implant 1330 forms an n-doped extension region 1326 on the iso-DENMOS transistor and extensions 1327 on the core NMOS transistor 1329. This implant also adds dopant 1330 to the n-well contact regions 1320 and 1321.

Figure 1E:
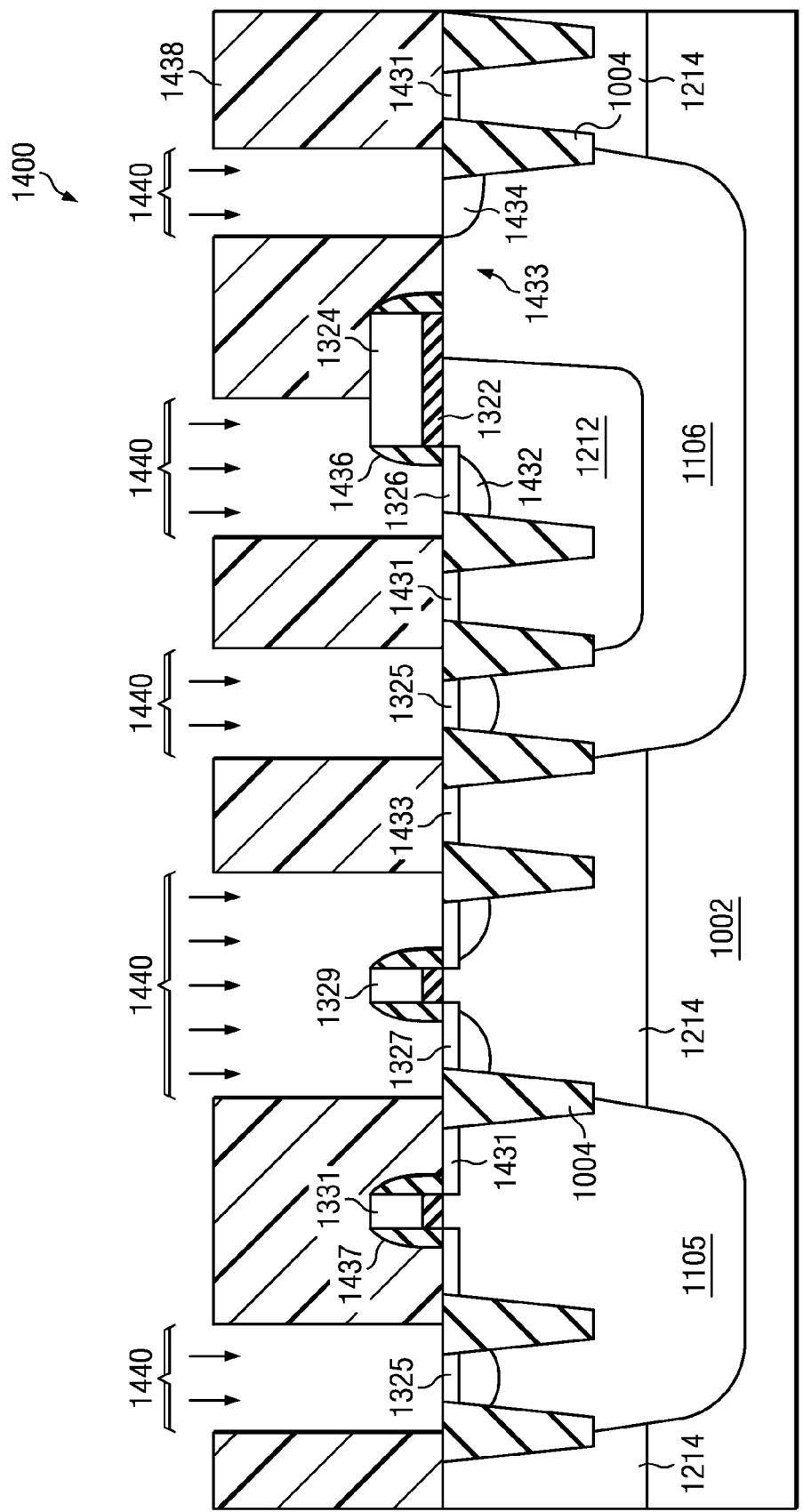

FIG. 1E shows the integrated circuit 1000 after addition of p-type extension implants 1431 and formation of sidewalls 1436 on the iso-DENMOS transistor and sidewalls 1437 on the core NMOS 1329 and core PMOS 1331 transistors. Following the formation of the sidewalls 1436 and 1437, an NSD photoresist pattern 1438 is formed on the surface of the integrated circuit 1000 with openings to allow the NSD implant 1440 into the source 1432 and drain 1434 regions of the iso-DENMOS transistor and also the source and drain of the core NMOS transistor 1329. When a high voltage is applied to the drain diffusion 1434, the lightly doped n-well 1106 fully depletes forming a drift region 1433 between the drain diffusion 1434 and the isolated p-well 1212. The voltage drop across this drift region 1433 may be sufficient to protect the gate dielectric 1322 under the iso-DENMOS transistor gate stack 1324.

Figure 1F:
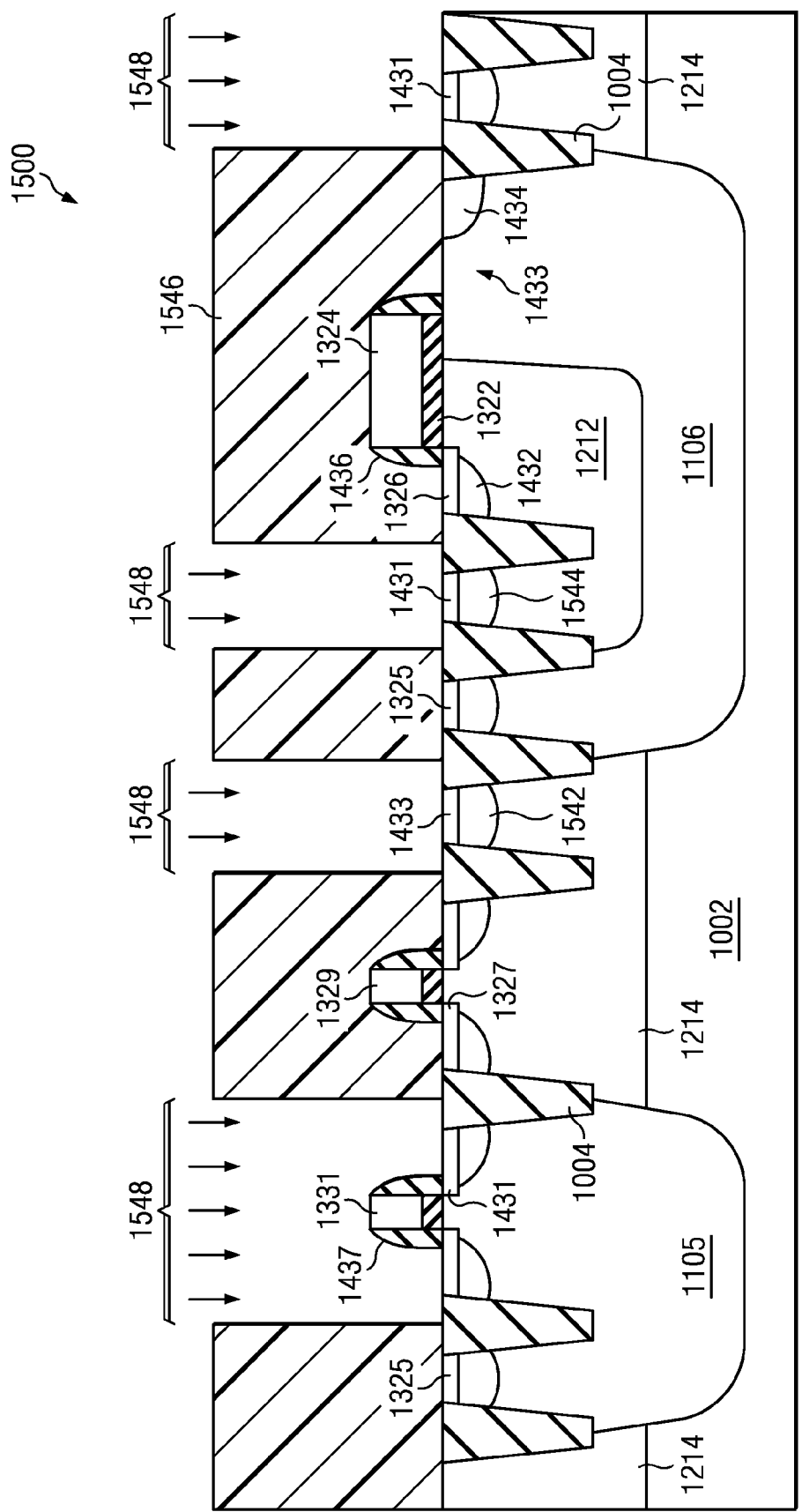

Referring now to FIG. 1F, the NSD photoresist pattern 1438 is removed and a PSD photoresist pattern 1546 with openings over the p-well contact regions 1542 and over the ci-p-well contact region 1544 is formed on the surface of the integrated circuit 1000. P-type implant 1548, usually boron plus BF2, forms the source and drain regions of the core PMOS transistor 1331 as well as the p-well and the ci-p-well contact regions, 1542 and 1544. Other species such as germanium may be added for preamorphization purposes or carbon to retard interstitial diffusion for sharper junction formation may also be added.

Figure 1G:
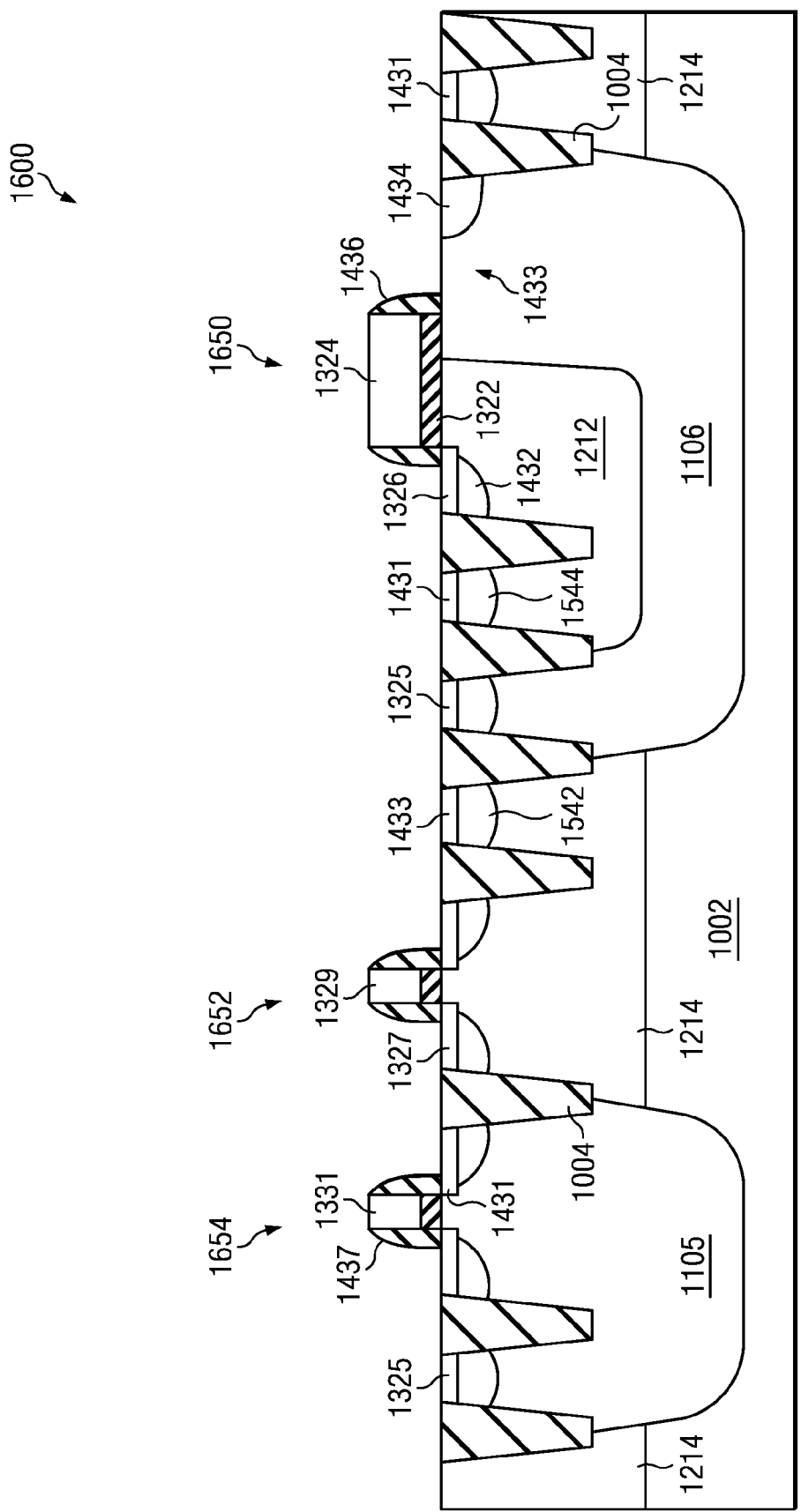

The iso-DENMOS transistor 1650, shown in FIG. 1G is formed using the same processing steps used to form the core NMOS 1652 and core PMOS 1654 transistors. No additional processing steps are added to the process flow to build the iso-DENMOS transistor 1650. Since the iso-DENMOS transistor is fully contained within n-well 1106, core transistors are isolated from any noise or electrical bounce that may occur when the iso-DENMOS transistor switches high voltage. Additional well known processing steps including silicide formation, contact formation, and interconnect formation among others follow to complete the integrated circuit 1000 processing.

Figure 2:
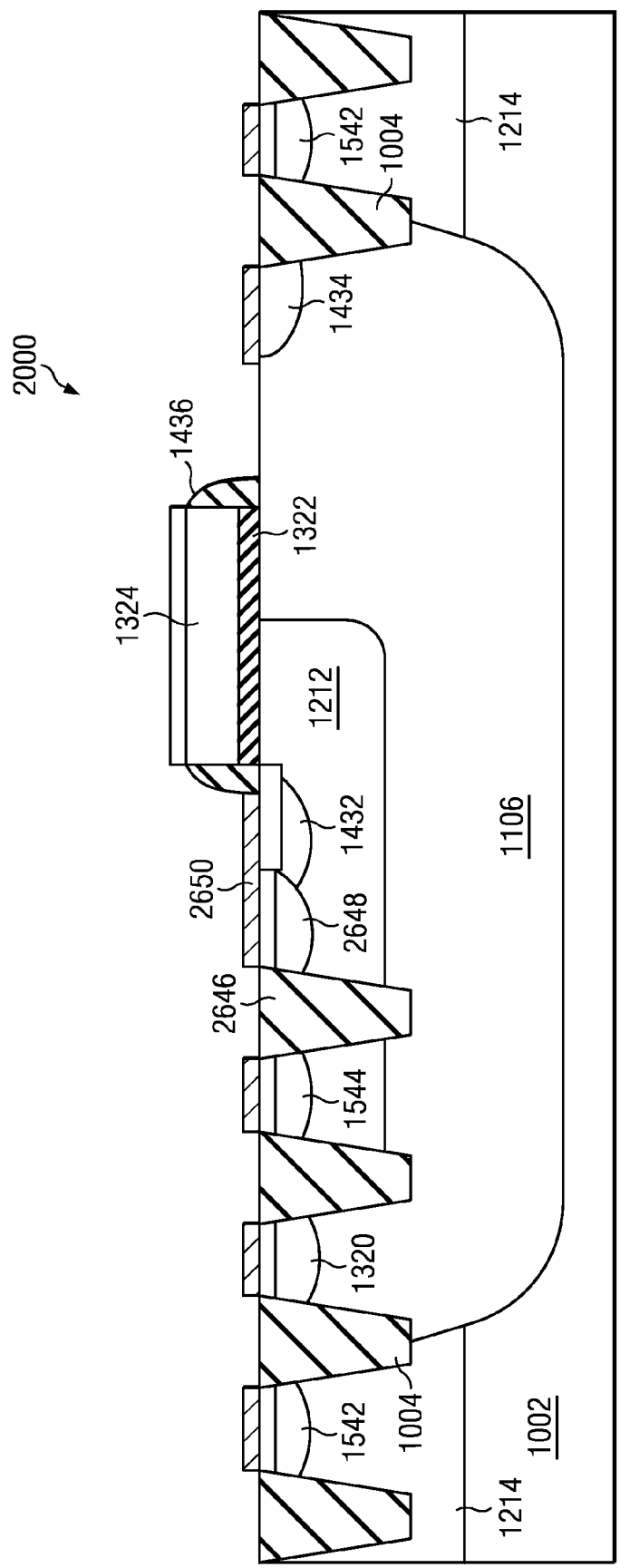
FIG. 2 is a cross-section of an isolated DENMOS transistor formed with a shallow compensated p-well with the source shorted to the compensated p-well.

FIG. 2 shows a second embodiment of an iso-DENMOS transistor 2000 according to this invention. As integrated circuits scale, wells get shallower. In this embodiment, the ci-p-well 2212 does not extend below the STI isolation regions 2004. Electrical continuity between the ci-p-well 2212 under the iso-DEMOS transistor 2324 and the ci-p-well in contact region 2544 is broken by the STI isolation 2004. In this embodiment, to provide electrical contact to the body of the iso-DENMOS transistor 2000, a P+ region 2648 is implanted adjacent to the N+ source 2432. Silicide 2650 shorts the ci-p-well contact 2648 and iso-DENMOS source 1432 regions together. In this embodiment, the source and body potential of the iso-DENMOS transistor are the same.

Figure 3A:
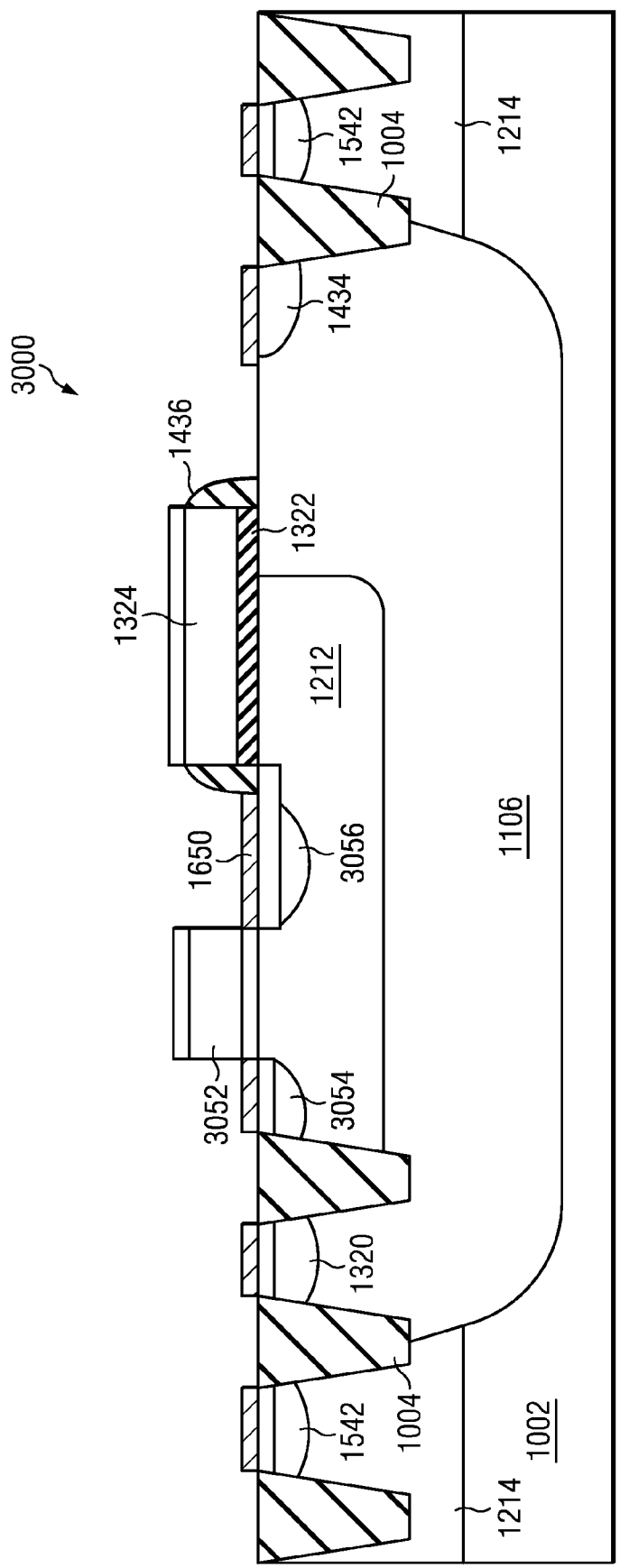
FIG. 3 is a cross-section of an isolated DENMOS transistor formed with a shallow compensated p-well with the source not shorted to the compensated p-well.
Figure 3B:
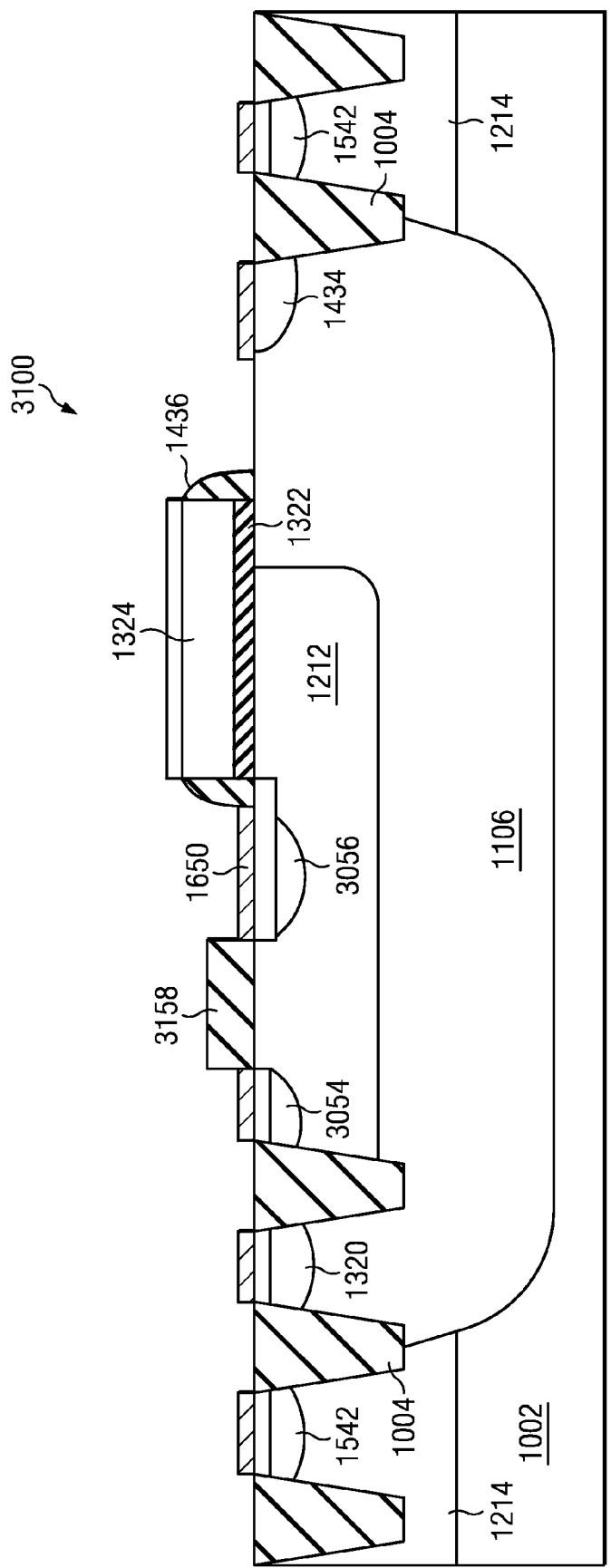

It may be desirable to independently control the source and body potential of the iso-DENMOS. For example, when the iso-DENMOS transistor is off the body potential may be lowered causing the turn on voltage (vt) of the iso-DENMOS transistor to rise. This reduces the off current of the iso-DENMOS transistor thereby reducing integrated circuit standby power. FIGS. 3A and 3B show additional embodiments of an iso-DENMOS transistor with a shallow ci-p-well 3212 and with a ci-p-well contact 3054 that is not shorted to the iso-DENMOS source contact 3056. In FIG. 3A, a piece of gate material 3052 adjacent to the source 3056 separates the ci-p-well contact 3054 from the iso-DENMOS source contact 3056 preventing them from being shorted together during silicication. In this embodiment, the source and body potential of the iso-DENMOS transistor may be independently controlled.

In FIG. 3B a silicide blocked region 3158 prevents the ci-p-well contact 3054 from being shorted to the iso-DENMOS source 3056. One common method to provide a silicide blocked region is to deposit a dielectric and then to pattern and etch it to leave dielectric in areas such as 3158 where silicide formation is not desired. This method may add a dielectric deposition, pattern, and etch to the baseline CMOS process flow unless silicide block already is in the baseline CMOS process flow.

Figure 4:
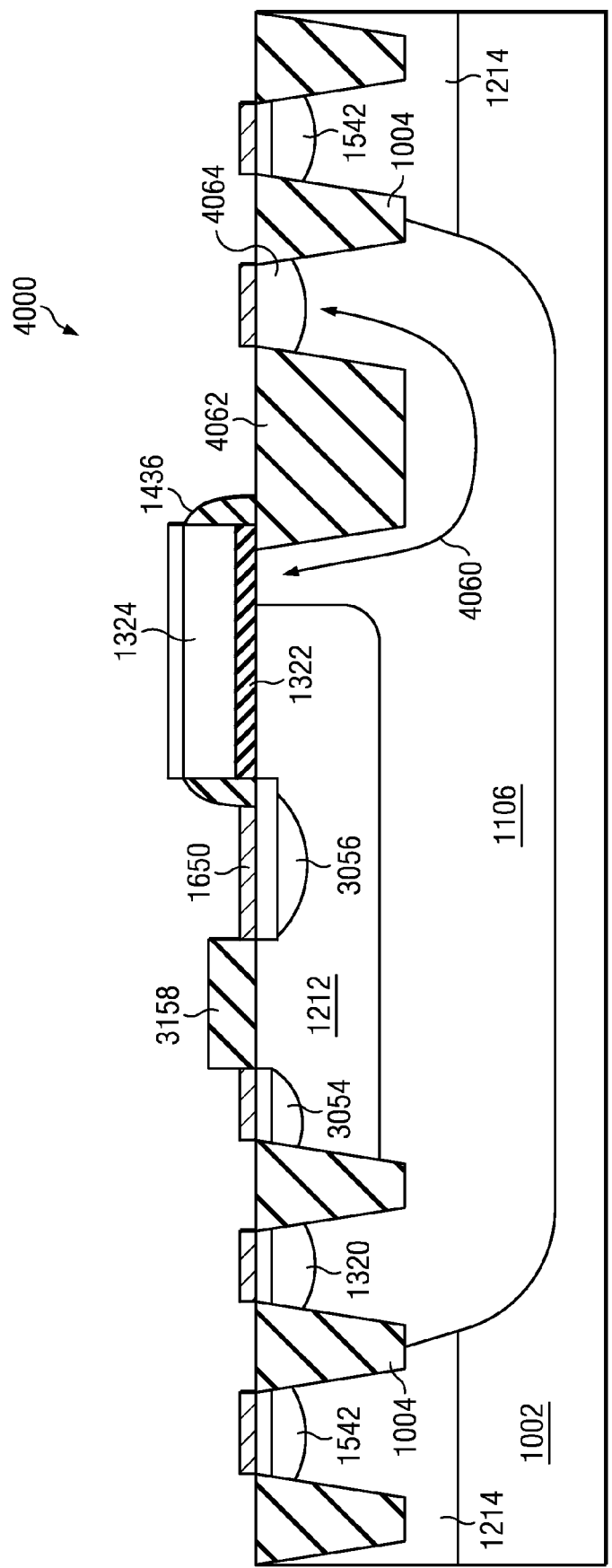
FIG. 4 is a cross-section of an isolated DENMOS transistor with a STI geometry used to extend the length of the extended drain.

FIG. 4 shows a higher voltage version of an iso-DENMOS transistor according to another embodiment of the present invention. An STI region 4062 is formed between the drain 4064 and gate 4324 of the iso-DENMOS transistor. This lengthens the lightly doped n-well region 4060 over which the depletion region forms before reaching the low voltage gate dielectric 4322. The longer depletion region between the drain contact 4064 and the gate oxide 4322 provides for a greater voltage drop. A higher voltage may be applied to the iso-DENMOS drain 4064 in this embodiment.

N-wells for core PMOS transistors and p-wells for core NMOS transistors are normally formed in baseline CMOS process flows. The above embodiments describe the formation of a ci-p-well wholly contained within the core n-well. This isolated p-well is formed using a baseline CMOS process flow with no additional processing steps. This adds additional functionality to the integrated circuit without adding cost or cycle time. The construction of an iso-DENMOS capable of switching higher voltage than the core NMOS transistors is also described. This iso-DENMOS transistor may be constructed using a baseline CMOS manufacturing flow with no additional photoresist patterning steps and no additional implantation steps. Versions of the iso-DENMOS with source tied to body and with source not tied to body are also described.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit containing an isolated DENMOS (iso-DENMOS) transistor comprising:
   simultaneously forming a first n-well and a second n-well, said first n-well and said second n-well having the same depth and dopant concentration;
   simultaneously forming a first p-well and a compensated, isolated p-well (ci-p-well), wherein said ci-p-well is formed within said second n-well;
   forming a core NMOS transistor in said first p-well;
   forming a core PMOS transistor in said first n-well; and
   forming said iso-DENMOS transistor in said second n-well, wherein said ci-p-well forms a body region of said iso-DENMOS transistor.

2. The method of claim 1, wherein dopant profiles of said first n-well and of said first p-well are optimized so that said ci-p-well is formed within said second n-well.

3. The method of claim 1 further comprising the steps of:
   simultaneously with forming core logic transistor gates, forming an iso-DENMOS transistor gate overlying a junction between said ci-p-well and said second n-well;
   forming an n-type source extension adjacent to said iso-DENMOS transistor gate and contained in said ci-p-well;
   forming sidewalls on said iso-DENMOS transistor gate;
   forming an n-type source adjacent to said iso-DENMOS transistor gate and contained in said ci-p-well region; and
   forming an n-type drain contained in said second n-well region and coupled to said iso-DENMOS transistor gate by a drift region.

4. The method of claim 3 further comprising forming a shallow trench isolation geometry contained in said second n-well, adjacent to said n-type drain and positioned between said n-type drain and said iso-DENMOS transistor gate.

5. The method of claim 3 further comprising:
   forming a contact to said ci-p-well adjacent to said n-type source; and
   forming a silicide over said contact and said n-type source wherein said silicide shorts said contact and said n-type source together.

6. The method of claim 3 further comprising:
   forming a silicide blocked region adjacent to said n-type source contained within said ci-p-well; and
   forming a contact to said ci-p-well wherein said contact is separated from said n-type source by said silicide blocked region.

7. The method of claim 6 wherein said ci-p-well is deeper than STI and wherein said silicide blocked region is formed using an STI geometry.

8. The method of claim 6 wherein said silicide blocked region is formed using a silicide block dielectric.

9. The method of claim 6 wherein said silicide blocked region is formed by depositing, patterning, and etching gate material simultaneously to depositing, patterning, and etching gates of core NMOS and core PMOS transistors.

* * * * *